(12) United States Patent
Kley

(10) Patent No.: US 6,802,646 B1
(45) Date of Patent: Oct. 12, 2004

(54) LOW-FRICTION MOVING INTERFACES IN MICROMACHINES AND NANOMACHINES

(75) Inventor: Victor B. Kley, Berkeley, CA (US)

(73) Assignee: General Nanotechnology LLC, Berkeley, CA (US)

( * ) Notice: Subject to any disclaimer, the term of this patent is extended or adjusted under 35 U.S.C. 154(b) by 0 days.

(21) Appl. No.: 10/094,149

(22) Filed: Mar. 7, 2002

Related U.S. Application Data
(60) Provisional application No. 60/287,677, filed on Apr. 30, 2001.

(51) Int. Cl.⁷ .............................................. F16C 17/00
(52) U.S. Cl. ............................. 384/42; 384/26; 384/29; 384/129; 384/297; 384/907.1; 29/89.43
(58) Field of Search .............................. 384/42, 26, 29, 384/297, 129, 907.1; 74/89.43

(56) References Cited

U.S. PATENT DOCUMENTS

| | | |
|---|---|---|
| 3,586,865 A | 6/1971 | Baker et al. |
| 3,812,288 A | 5/1974 | Walsh et al. |
| 4,115,806 A | 9/1978 | Morton |
| 4,604,520 A | 8/1986 | Pohl |
| 4,672,559 A | 6/1987 | Jansson et al. |
| 4,673,477 A | 6/1987 | Ramalingram et al. |
| RE32,457 E | 7/1987 | Matey |
| 4,681,451 A | 7/1987 | Guerra et al. |
| 4,697,594 A | 10/1987 | Mayo, Jr. |
| 4,793,201 A * | 12/1988 | Kanai et al. ............... 74/89.43 |
| 4,831,614 A | 5/1989 | Duerig |
| 4,866,986 A | 9/1989 | Cichanski |
| 4,907,195 A | 3/1990 | Kazan et al. |
| 4,924,091 A | 5/1990 | Hansma et al. |
| 4,954,704 A | 9/1990 | Elings et al. |
| 4,999,495 A | 3/1991 | Miyata et al. |
| 5,001,344 A | 3/1991 | Kato et al. |
| 5,010,249 A | 4/1991 | Nishikawa |
| 5,015,850 A | 5/1991 | Zdeblick |
| 5,018,865 A | 5/1991 | Ferrell et al. |
| 5,025,346 A | 6/1991 | Tang |
| 5,038,322 A | 8/1991 | Van Loenen |
| 5,043,577 A | 8/1991 | Pohi |
| 5,047,633 A | 9/1991 | Finlan et al. |
| 5,047,649 A | 9/1991 | Hodgson et al. |
| 5,072,116 A | 12/1991 | Kawade et al. |
| 5,081,390 A | 1/1992 | Elings et al. |
| 5,105,305 A | 4/1992 | Betzig et al. |
| 5,107,112 A | 4/1992 | Yanagisawa et al. |
| 5,108,865 A | 4/1992 | Zwaldo et al. |
| 5,118,541 A | 6/1992 | Yamamoto et al. |

(List continued on next page.)

FOREIGN PATENT DOCUMENTS

| | | |
|---|---|---|
| EP | 0325056 | 7/1989 |
| JP | 61-133065 | 6/1985 |
| JP | 1-262403 | 10/1989 |
| JP | 7-105580 | 4/1995 |
| WO | WO 96/03641 A1 | 2/1996 |
| WO | WO 97/04449 | 2/1997 |
| WO | WO 98/34092 A2 | 8/1998 |
| WO | WO 01/03157 | 1/2001 |

OTHER PUBLICATIONS

Jaschke et al. "Deposition of Organic Material by the Tip of a Scanning Force Microscope," Langmuir 11:1061–1064 (1995).

(List continued on next page.)

Primary Examiner—Lenard A. Footland
(74) Attorney, Agent, or Firm—Townsend and Townsend and Crew LLP

(57) ABSTRACT

A low-friction device having a moving interface comprising first and second members. Each of the members has a maximum dimension of about 100 $\mu$m or less between any two points. At least the first member is formed of diamond and the first and second members are in sliding contact or meshing contact.

33 Claims, 4 Drawing Sheets

Temperature of Diamond-Silicon Dynamic Interface
Up to the Flash Temperature

U.S. PATENT DOCUMENTS

| | | |
|---|---|---|
| 5,138,159 A | 8/1992 | Takase et al. |
| 5,142,145 A | 8/1992 | Yasutake |
| 5,148,308 A | 9/1992 | Kopelman |
| 5,155,589 A | 10/1992 | Gere |
| 5,166,520 A | 11/1992 | Prater et al. |
| 5,187,367 A | 2/1993 | Miyazaki |
| RE34,214 E | 4/1993 | Carlsson et al. |
| 5,210,410 A | 5/1993 | Barret |
| 5,216,631 A | 6/1993 | Sliwa |
| 5,220,555 A | 6/1993 | Yanagisawa |
| 5,231,286 A | 7/1993 | Kajimura et al. |
| 5,241,527 A | 8/1993 | Eguchi |
| 5,249,077 A | 9/1993 | Laronga |
| 5,254,854 A | 10/1993 | Betzig |
| 5,260,824 A | 11/1993 | Okada et al. |
| 5,276,672 A | 1/1994 | Miyazaki |
| 5,278,704 A | 1/1994 | Matsuda |
| 5,283,437 A | 2/1994 | Greshner et al. |
| 5,289,004 A | 2/1994 | Okada et al. |
| 5,289,408 A | 2/1994 | Mimura |
| 5,297,130 A | 3/1994 | Tagawa |
| 5,299,184 A | 3/1994 | Yamano |
| 5,302,239 A | 4/1994 | Roe et al. |
| 5,308,974 A | 5/1994 | Elings et al. |
| 5,317,152 A | 5/1994 | Takamatsu |
| 5,317,533 A | 5/1994 | Quate |
| 5,319,961 A | 6/1994 | Matsuyama et al. |
| 5,319,977 A | 6/1994 | Quate et al. |
| 5,322,735 A * | 6/1994 | Fridez et al. ............... 428/357 |
| RE34,708 E | 8/1994 | Hansma et al. |
| 5,338,932 A | 8/1994 | Theodore et al. |
| 5,343,460 A | 8/1994 | Miyazaki |
| 5,349,735 A | 9/1994 | Kawase |
| 5,353,632 A | 10/1994 | Nakagawa |
| 5,354,985 A | 10/1994 | Quate |
| 5,357,109 A | 10/1994 | Kusumoto |
| 5,357,110 A | 10/1994 | Statham |
| 5,360,977 A | 11/1994 | Onuki et al. |
| 5,362,963 A | 11/1994 | Kopelman et al. |
| 5,373,494 A | 12/1994 | Kawagishi |
| 5,389,475 A | 2/1995 | Yanagisawa |
| 5,392,275 A | 2/1995 | Kawada et al. |
| 5,393,647 A | 2/1995 | Neukermans et al. |
| 5,396,483 A | 3/1995 | Matsida |
| 5,408,094 A | 4/1995 | Kajimura |
| 5,412,641 A | 5/1995 | Shinjo |
| 5,414,260 A | 5/1995 | Takimoto et al. |
| 5,414,690 A | 5/1995 | Shido et al. |
| 5,416,331 A | 5/1995 | Ichikawa et al. |
| 5,418,363 A | 5/1995 | Elings et al. |
| 5,426,631 A | 6/1995 | Miyazaki et al. |
| 5,453,970 A | 9/1995 | Rust et al. |
| 5,455,420 A | 10/1995 | Ho et al. |
| 5,461,605 A | 10/1995 | Takimoto |
| 5,463,897 A | 11/1995 | Prater et al. |
| 5,471,458 A | 11/1995 | Oguchi et al. |
| 5,472,881 A | 12/1995 | Beebe et al. |
| 5,490,132 A | 2/1996 | Yagi et al. |
| 5,495,109 A | 2/1996 | Lindsay et al. |
| 5,502,306 A | 3/1996 | Meisburger et al. |
| 5,506,829 A | 4/1996 | Yagi |
| 5,510,615 A | 4/1996 | Ho et al. |
| 5,519,686 A | 5/1996 | Yanagisawa et al. |
| 5,548,117 A | 8/1996 | Nakagawa |
| 5,559,328 A | 9/1996 | Weiss et al. |
| 5,560,244 A | 10/1996 | Prater et al. |
| 5,583,286 A | 12/1996 | Matsuyama |
| 5,602,820 A | 2/1997 | Wickramasinghe et al. |
| 5,610,898 A | 3/1997 | Takimoto |
| 5,623,476 A | 4/1997 | Eguchi |
| 5,634,230 A | 6/1997 | Maurer |
| 5,644,512 A | 7/1997 | Chernoff et al. |
| 5,679,952 A | 10/1997 | Lutwyche et al. |
| 5,717,680 A | 2/1998 | Yamano |
| 5,721,721 A | 2/1998 | Yanagisawa |
| 5,751,683 A | 5/1998 | Kley |
| 5,756,997 A | 5/1998 | Kley |
| 5,763,879 A | 6/1998 | Zimmer et al. |
| 5,804,709 A | 9/1998 | Bougoin et al. |
| 5,821,410 A | 10/1998 | Xiang et al. |
| 5,825,670 A | 10/1998 | Chernoff et al. |
| 5,865,978 A | 2/1999 | Cohen |
| 5,874,726 A | 2/1999 | Haydon |
| 5,883,387 A | 3/1999 | Matsuyama et al. |
| 5,922,214 A | 7/1999 | Liu et al. |
| 6,031,756 A | 2/2000 | Gimsewski et al. |
| 6,066,265 A | 5/2000 | Galvin et al. |
| 6,101,164 A | 8/2000 | Kado et al. |
| 6,144,028 A | 11/2000 | Kley |
| 6,173,604 B1 | 1/2001 | Xiang et al. |
| 6,229,138 B1 | 5/2001 | Kley |
| 6,229,609 B1 | 5/2001 | Muramatsu et al. |
| 6,252,226 B1 | 6/2001 | Kley |
| 6,265,711 B1 | 7/2001 | Kley |
| 6,337,479 B1 | 1/2002 | Kley |
| 6,340,813 B1 | 1/2002 | Tominaga et al. |
| 6,353,219 B1 | 3/2002 | Kley |
| 6,517,249 B1 * | 2/2003 | Doll ........................ 384/492 |
| 2002/0007667 A1 | 1/2002 | Pohl et al. |

OTHER PUBLICATIONS

Ager et al., "Multilayer hard carbon films with low wear rates," *Surface and Coatings Technology*, 91:91–94 (1997).

Betzig et al "Near–Field Optics: Microscopy Spectroscopy and Surface Modification Beyond the Diffraction Limit" Science 257:(1992).

Dai et al. "Nanotubes as nanoprobes in scanning probe microscopy," Nature 384:147–150 (1996).

Davis "Deposition characterization and device development in diamond silicon carbide and gallium nitride thin films" J. Vac. Sci. Technol. A 11(4). Jul./Aug. (1993).

Diaz et al., An Improved Fabrication Technique for Porous Silicon, Rev. Sci. Instrum.64 (2), Feb. 1993, pp. 507–509.

Givargizov et al "Growth of diamond particles on sharpened silicon tips" Materials Letters 18:(1993).

Gomyo et al., Effect of Electrochemical Treatments on the Photoluminescence from Porous Silicon, J. Electrochem. Soc. vol. 139, No. 9, Sep. 1992, pp. L86–L88.

Nossarzewska–Orlowska et al., Photoluminescence Properties of Porous Silicon Prepared by Electrochemical Etching of Si Epitaxial Layer, Acta Physica Polonica A, No.4. vol. 84 (1993), pp. 713–716.

Rasmussen et al. "Fabrication of an All–metal Atomic Force Microscope Probe," IEEE (1997).

Rossow et al., Influence of the Formation Conditions on the Microstructure of Porous Silicon Layers Studied by Spectroscopic Ellipsometry, Thin Solid Films, 255 (1995), pp. 5–8.

Smestad et al., Photovoltaic Response in Electrochemically Prepared Photoluminescent Porous Silicon, Solar Energy Materials and Solar Cells, 26 (1992), pp. 277–283.

Tang "Electrostatic comb drive for resonant sensor and actuator applications." Abstract of dissertation at the University of California at Berkeley (1990).

Toledo–Crow et al "Near–field differential scanning optical microscope with atomic force regulation" Appl. Phys. Lett. 60: (1992).

Van Hulst et al "Near–field optical microscope using a silicon–nitride probe" Appl. Phys. Lett. 62: (1993).

Watson et al "The Radiation Patterns of Dielectric–Rods—Experiment Theory" Journal of Applied Physics 19: (1948).

* cited by examiner

LOW-FRICTION MOVING INTERFACES IN MICROMACHINES AND NANOMACHINES

CROSS-REFERENCES TO RELATED APPLICATIONS

This application claims priority from the following provisional application, the entire disclosure of which is incorporated by reference in its entirety for all purposes:

U.S. application Ser. No. 60/287,677, filed Apr. 30, 2001 by Victor B. Kley for "Scanning Probe Microscopy and Nanomachining."

The following six U.S. patent applications, including this one, are being filed concurrently and the disclosure of each other application is incorporated by reference in this application in its entirety for all purposes:

U.S. patent application Ser. No. 10/094,148, filed Mar. 07, 2002 by Victor B. Kley for "Method and Apparatus for Scanning in Scanning Probe Microscopy and Presenting Results";

U.S. patent application Ser. No. 10/093,842, filed Mar. 7, 2002 by Victor B. Kley for "Nanomachining Method and Apparatus";

U.S. patent application Ser. No. 10/094,408, filed Mar. 7, 2002 by Victor B. Kley for "Active Cantilever for Nanomachining and Metrology";

U.S. patent application Ser. No. 10/094,411, filed Mar. 7, 2002 by Victor B. Kley for "Methods and Apparatus for Nanolapping";

U.S. patent application Ser. No. 10/094,149, filed Mar. 7, 2002 by Victor B. Kley for "Low Friction Moving Interfaces in Micromachines and Nanomachines"; and U.S. patent application Ser. No. 10/093,947, filed Mar. 7, 2002 by Victor B. Kley and Robert T. LoBianco for "Method and Apparatus for Tool and Tip Design for Nanomachining and Measurement".

The following U.S. patents are incorporated by reference in their entirety for all purposes:

U.S. Pat. No. 6,144,028, issued Nov. 7, 2000 to Victor B. Kley for "Scanning Probe Microscope Assembly and Method for Making Confocal, Spectrophotometric, Near-Field, and Scanning Probe Measurements and Associated Images;"

U.S. Pat. No. 6,252,226, issued Jun. 26, 2001 to Victor B. Kley for "Nanometer Scale Data Storage Device and Associated Positioning System;"

U.S. Pat. No. 6,337,479, issued Jan. 8, 2002 to Victor B. Kley for "Object Inspection and/or Modification System and Method;" and U.S. Pat. No. 6,339,217, issued Jan. 5, 2002 to Victor B. Kley for "Scanning Probe Microscope Assembly and Method for Making Confocal, Spectrophotometric, Near-Field, and Scanning Probe Measurements and Associated Images."

The disclosure of the following published PCT application is incorporated by reference in its entirety for all purposes:

WO 01/03157 (International Publication Date: Jan. 11, 2001) based on PCT Application No. PCT/US00/18041, filed Jun. 30, 2000 by Victor B. Kley for "Object Inspection and/or Modification System and Method."

BACKGROUND OF THE INVENTION

This application relates generally to micromachines and nanomachines and more specifically to devices providing low-friction rotational and translational interfaces for micromachine and nanomachine contacts.

Micromachines and nanomachines are poised to solve mechanical problems at the molecular and atomic level. Such machines may solve problems in environments were other devices, such as electronic devices, fail. For example, microscale mechanical memories may be of use in environments, such as space, in which semiconductor based devices have high fault rates due to high-energy cosmic radiation. Further, microscale mechanical machines may be of surgical use, reaching areas of the body not otherwise accessible or manipulable by traditional surgical tools and techniques.

At small scale, for example in the hundreds and tens of micron range and below, mechanical elements exhibit problematic behavior that either 1) does not arise or 2) is of little consequence at relatively larger scale. For example, meshed gears in macroscale machines do not tend to exhibit problems due to sticking, which is the sticking and fusing of different elements or portions of elements into a union. However, at smaller scale, such problems can arise.

Lithographic techniques have been deployed to make relatively small mechanical devices, for example, relatively small gears etched from silicon wafers. However, such relatively small silicon gears have a tendency to stick and fuse to each other. If such gears are in mechanical motion when sticking between the gears occurs, the gears may gall each other or worse tear each other apart.

Lubricants have been applied to relatively small mechanical interfaces in an attempt to limit friction, sticking, and galling. However, like solid bits of matter of relatively small scale, liquids at relatively small scale also exhibit problematic behavior that would be of little consequence at relatively larger scale. For example, surface tension causes relatively small quantities of liquid to form small droplets that tend not to flow across a surface, thus limiting a lubricant's effectiveness.

Consequently, new microscale and nanoscale devices are sought which provide for improved performance.

BRIEF SUMMARY OF THE INVENTION

In accordance with the invention low-friction moving interfaces in micromachines and nanomachines include low-friction sliding interfaces. In one aspect of the invention, a device has first and second members in sliding contact. Each the members has a maximum dimension of about 100 µm or less between any two points and one of the first and second members is formed of diamond. In another aspect of the invention, a device has a toothed member and a tooth-engaging member in meshing contact. Both the toothed member and tooth-engaging member have dimension of about 100 µm or less between any two points and one of the toothed member and tooth-engaging member is formed of diamond.

A further understanding of the nature and advantages of the present invention may be realized by reference to the remaining portions of the specification and the drawings.

DETAILED DESCRIPTION OF THE INVENTION

Introduction

The following description sets forth embodiments of low-friction moving interfaces in micromachines and nanomachines according to the invention. Embodiments of the invention can be applied to sliding and/or meshing mechanical contacts.

Diamond is a very slippery crystal. Diamond in mechanical contact with crystals such as diamond itself or silicon exhibits relatively low-frictional heating and has a tendency not to fuse with itself or silicon. Further, the flash temperature of diamond-silicon interfaces is relatively high. The flash temperature is that at which bodies in frictional contact tend to gall each other. The flash temperature of various interfaces can be estimated by taking into account, for example, the speed at which surfaces move with respect to each other and the forces at the interface. For example, see "Tribology and Mechanics of Magnetic Storage Devices," publisher Springer, pp. 366–411, by Bhushan in which a general formalism is developed to calculate flash temperatures.

Figure 1:
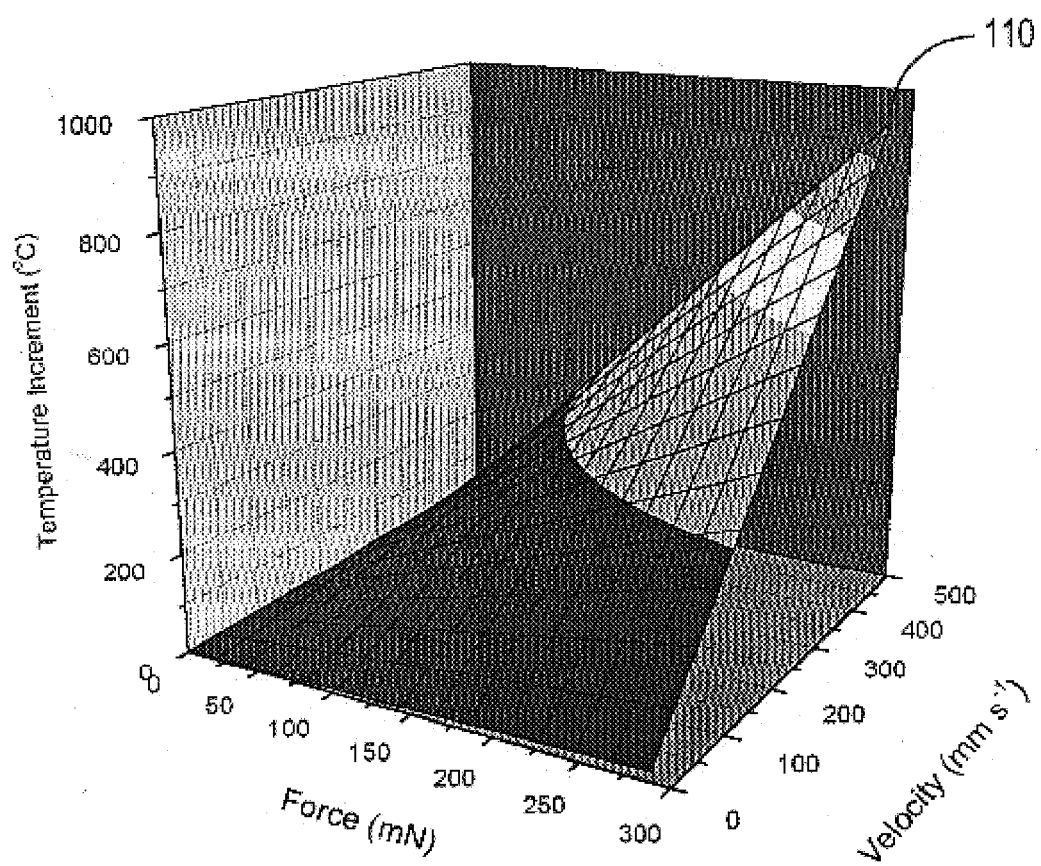
FIG. 1 is a graph of the temperature of a diamond-silicon dynamic interface for a relatively small diamond according to a mathematical model of the interface.

FIG. 1 is a graph of a mathematical modeling of the temperature of a dynamic diamond-silicon interface at various interface forces and velocities. The diamond-silicon interface modeled is that of a diamond rod having a flat circular end sliding across a planar piece of silicon. The diameter of the flat circular end of the rod is about 50 nm at the interface. As indicated by the graph, the temperature of the diamond and silicon forming the interface rises from frictional heating as the force and/or velocity of the diamond and silicon increase. Pinnacle 110 at the top right of the graph represent the flash temperature of the interface. As can be seen, the flash temperature, is between 900° C. and 1000° C. The interface force of the diamond on silicon at the flash temperature is between 275 millinewtons and 300 millinewtons and the velocity of the surfaces relative to each other is about 500 millimeter/second. Forces and velocities in these ranges are relatively high indicating the general durability of the interface. While the graph represent only a single geometric interface of diamond and silicon in frictional contract, an impetus is created for the manufacture of diamond-silicon mechanical interfaces of relatively small scale.

Described below are various embodiments where two members engage each other in different ways, referred to as sliding contact and meshing contact. These types of interaction will be defined below in connection with the specific embodiments. In these embodiments, both of the members may be diamond or one of the members may be diamond with the other being, for example, silicon, quartz, a III–V material such as gallium arsenide, and the like. While substances such as silicon and gallium arsenide are of limited mechanical use at macroscale dimensions (e.g. greater than 1 millimeter) due to their fragility, such substances suffer less from fragility at relatively smaller scales, (e.g. 100 $\mu$m). At such small scales, each of the aforementioned materials in such contact with diamond provides for devices that have relatively low friction and are relatively mechanically sound. Further, each of the aforementioned materials has a relatively high flash temperature in sliding contact with diamond, for example, as high as 900° C. and above. Thus at normal operating temperature, (e.g., 300° C.) such materials tend not to gall each other.

Embodiments Having Sliding Contact

A "sliding contact" is defined herein as a first member that is in dynamic frictional contact with a second member, such that the first member and second member have surfaces that are in smooth continuous contact.

Figure 2:
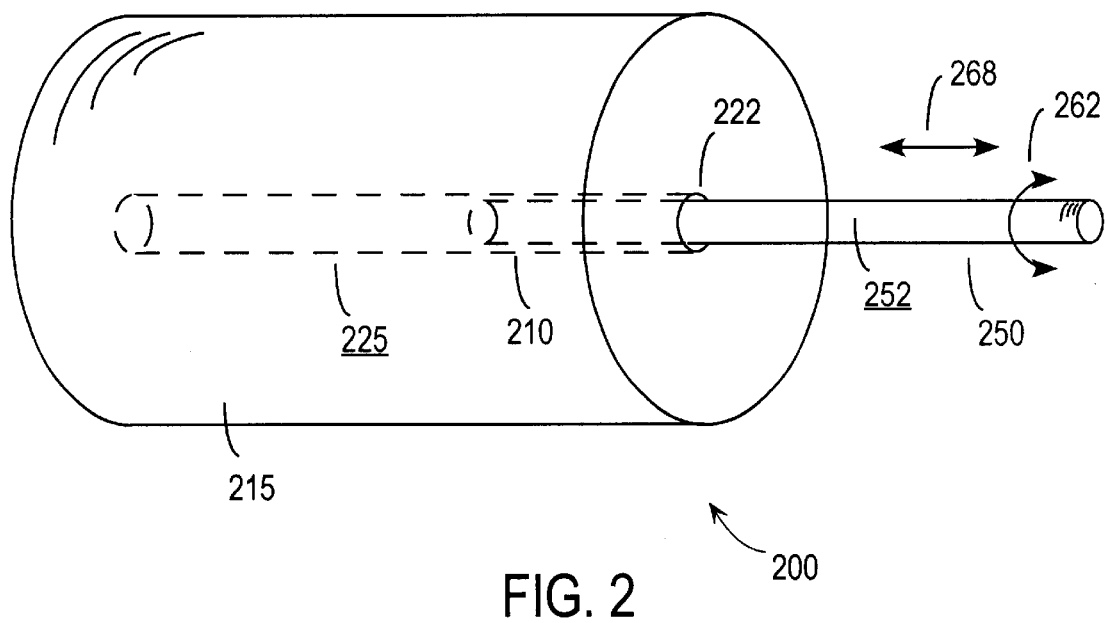
FIG. 2 is an overall perspective view of a mechanical device having a low-friction moving interface according to an embodiment of the present invention.

FIG. 2 is an overall perspective view of a mechanical device 200 having a low-friction moving interface 210 according to an embodiment of the present invention. The mechanical device includes a first member 215 that has a circular aperture 222. Portions of the aperture are indicated in phantom view. The aperture has a surface denoted by reference numeral 225. The mechanical device includes a second member 250 in the shape of a spindle having a rounded surface 252, portions of which are shown in phantom. As shown, the second member is fitted into the aperture. Low-friction moving interface 210 is identified as the areas at which the aperture surface and the second member are in sliding contact. The first member and second member may have a rotational degree of motion with respect to each other (as indicated by double-headed arrow 262), a translational degree of motion with respect to each other (as indicated by double-headed arrow 268), or both.

First member 215 and second member 250 may each be a single or multicrystalline structure. For example, first member 215 may be a single diamond crystal or a polycrystalline diamond.

The first and second members may be fabricated using a variety of techniques. For example, a member comprising silicon may be etched from a silicon wafer using known lithographic techniques or may be cut from a silicon wafer using cutting and sweeping techniques discussed in the above referenced U.S. patent application for "Nanomachining Method and Apparatus," Attorney Docket No. 020921-001430US. Alternatively, a member comprising silicon may be formed by lapping techniques such as those discussed in the above referenced U.S. patent application for "Methods and Apparatus for Nanolapping," Attorney Docket No. 020921-001450US. Each of these fabrication techniques is similarly applicable to diamond members, quartz members, and the like. Those of skill in the art will know of other useful fabrication techniques.

First member 215 may be coated into the aperture of another device such as a disk. A first member so positioned is commonly referred to as a bushing. For example, a first member comprising diamond may be coated into an aperture in a silicon disk. A first member so positioned may be formed, for example, by first forming a diamond-like carbon layer in the aperture and second growing a diamond onto the diamond-like carbon layer. Diamond-like carbon may be coated into an aperture via a vacuum arc process or via ion-beam techniques and grown using plasma-enhanced chemical vapor deposition. Those of skill in the art will know other useful coating processes for diamond-like carbon. Diamond can also subsequently be grown onto the diamond-like carbon in a diamond-anvil cell or other high-pressure device.

According to a specific embodiment of the invention, each of the first and second members has a maximum dimension of about 100 μm or less between any two points. According to another embodiment, each of the first and second members has a maximum dimension of about 5 μm or less between any two points.

Figure 3:
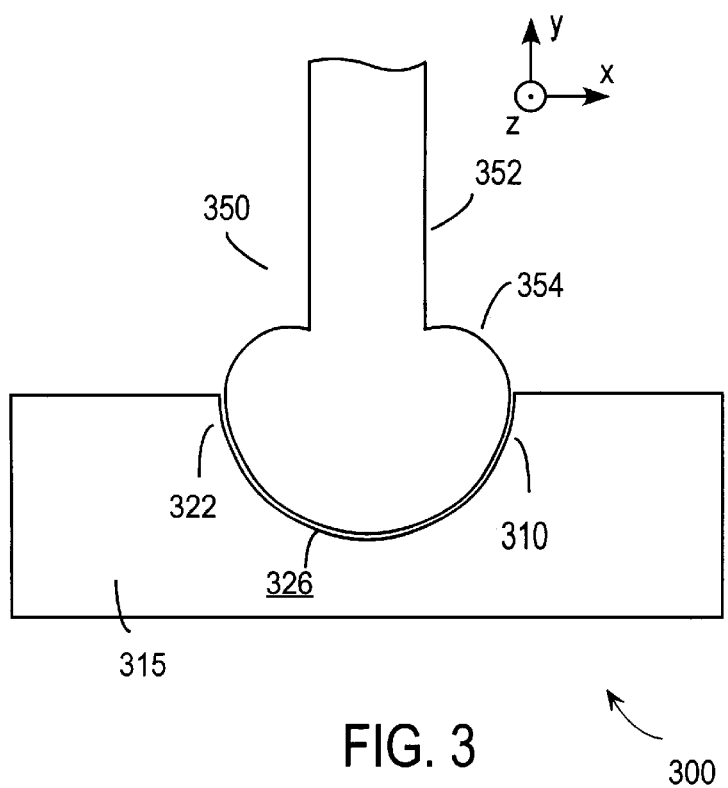
FIG. 3 is a schematic cross-sectional view of another mechanical device having a low-friction moving interface according to another embodiment of the present invention.

FIG. 3 is a schematic cross-sectional view of a mechanical device 300 having a low-friction moving interface 310 according to another embodiment of the present invention. The mechanical device includes a first member 315 that has a round socket 322, which is defined by surface 326. Mechanical device 300 includes a second member 350 that has an arm portion 352 and a ball end 354. The ball end of the second member is in sliding contact with surface 326. Such a configuration is commonly referred to as a ball-and-socket joint.

For consistency and clarity, a particular coordinate system will be shown and referred to. FIG. 3 is considered to lie in the x-y plane, and the z-axis will be considered to extend out of the page. In accordance with standard symbology, an axis extending out of the page will be denoted by a dot in a circle while an axis extending into the page will be denoted by a+ in a circle. The cross-sectional view of FIG. 3 thus shows mechanical device 300 extending laterally in the x-y plane. In most instances, references to direction and orientation that mention an axis (e.g., the x-axis) or a plane (e.g., the x-y plane) should be considered to include lines parallel to that axis, or planes parallel to that plane First and second members 315 and 350 may have a variety of rotational degrees of motion with respect to each other, for example, member 350 may rotate relative to member 315 about the z-axis, the x-axis, or any axis laying between the z and x-axes.

Figure 4:
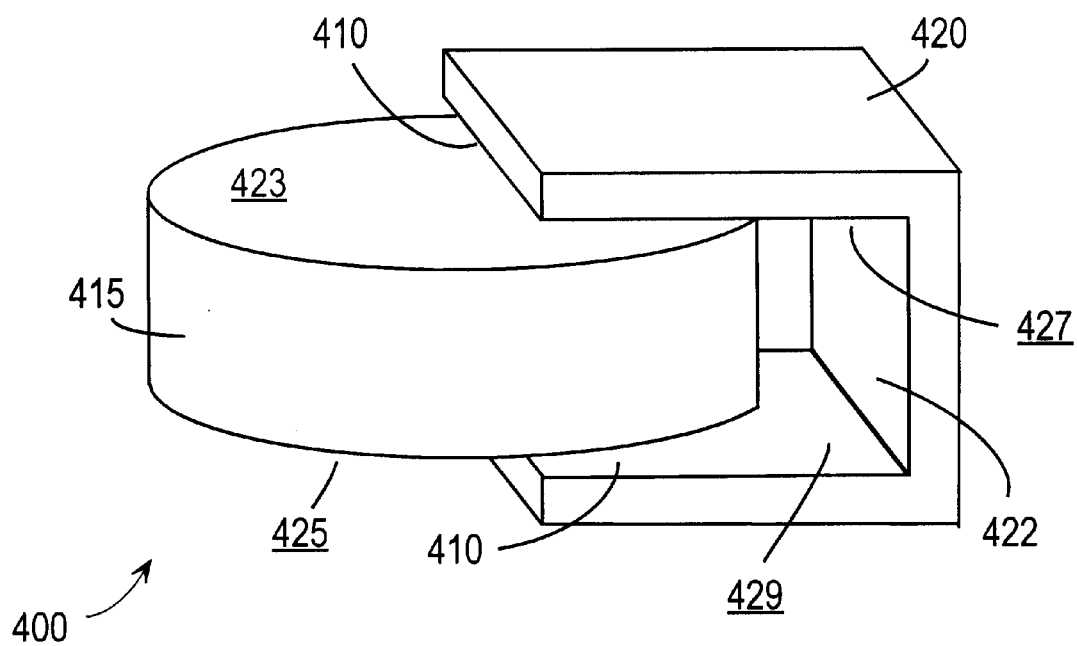
FIG. 4 is a schematic cross-sectional view of another mechanical device having a low-friction moving interface according to another embodiment of the present invention.

FIG. 4 is an overall perspective view of a mechanical device 400 having low-friction moving interfaces 410 according to an embodiment of the present invention. The mechanical device includes a first member 415 in the shape of a plate, and a second member 420 having a slot 422. A portion of first member 415 is inserted into slot 422. The first member spins such that portions of its surfaces 423 and 425 are in sliding contact with surfaces 427 and 429, respectively.

According to a specific embodiment of the invention, each of the members has a maximum dimension of about 100 μm or less between any two points. According to another embodiment, each of the members each has a maximum dimension of about 5 μm or less between any two points. First and second members 410 and 420 may be fabricated by a variety of processes such as those described above for the fabrication of mechanical device 200 shown in FIG. 2.

Mechanical devices having components (e.g., diamond plate and silicon slotted member) providing low-friction translational contact are deployable for a variety of tasks. For example, mechanical device 400 may be of use as a fluid pump. The low-friction moving interface can drag a fluid between ends of the slot, thus providing pumping. Further, such a device, made of say diamond and silicon or diamond and diamond, provides for tremendous translational rates. For example, a diamond plate in a silicon slot of the dimension discussed above may be turned at millions or more revolutions per second prior to reaching the flash temperature.

Each of devices 200, 300, and 400 may be bearing type devices, wherein one of the members provide support, guidance, and reduces the friction of motion between the other member and moving or fixed machine parts (not pictured in FIGS. 2, 3, or 4). Other moving or fixed machine parts may include, for example, a housing (e.g., a journal box) containing one of the devices, or additional members in sliding contact devices 200, 300, and 400.

Embodiments Having Meshing Contact

A "meshing contact" is defined herein as a "toothed member" being in frictional contact with a "tooth-engaging member," such that the toothed member meshes with the tooth-engaging member to transmit motion or to change direction or speed.

Figure 5:
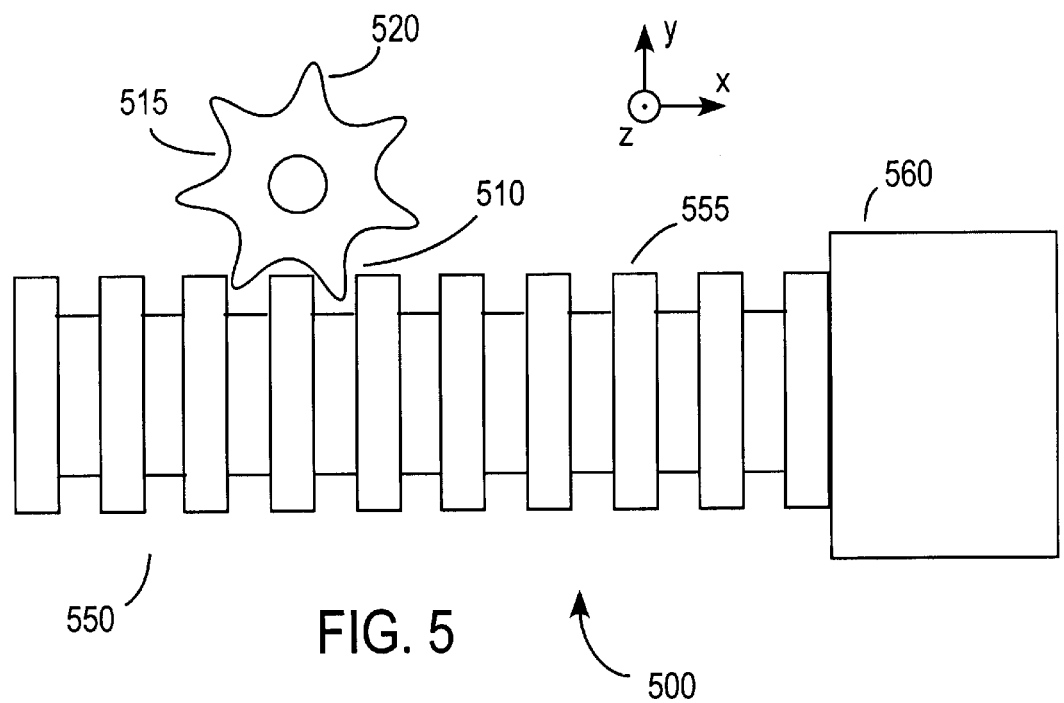
FIG. 5 is a schematic cross-sectional view of another mechanical device having a low-friction moving interface according to another embodiment of the present invention.

FIG. 5 is a schematic cross-sectional view of a mechanical device 500 having a low-friction moving interface 510 according to another embodiment of the present invention. The mechanical device includes a gear 515 (an example of a toothed member) that has a plurality of gear teeth 520 and includes a rack 550 (an example of a tooth-engaging member) that has a plurality of gear teeth 555. As shown, gear teeth 520 and gear teeth 555 are in meshing contact. Mechanical device 500 provides for two types of motion: (a) the rack may be moved laterally along the x-axis causing the gear to rotate about the z-axis, or (b) the gear may be rotated causing the rack to be translated. Translation device 560 coupled to rack 550 may provide such translations of the rack. Translation device 560 may include a variety of devices, such as, piezoelectric transducers, thermal expansion/contraction devices, mechanical actuators, and the like. Further, such translation devices may be coupled to both ends of the rack for further control.

While rack 550 is shown to have teeth that extend beyond the region where the gear and rack mesh, the teeth may extend a lesser amount, for example, the teeth may be limited to the region where the gear and rack mesh.

According to a specific embodiment of the invention, each of the gear and rack has a maximum dimension of about 100 μm or less between any two points. According to another embodiment, each of the gear and rack has a maximum dimension of about 5 μm or less between any two points. Gears and racks made of materials such as those discussed may be fabricated by a variety of processes such as those described above for the fabrication of mechanical device 200 shown in FIG. 2.

Figure 6:
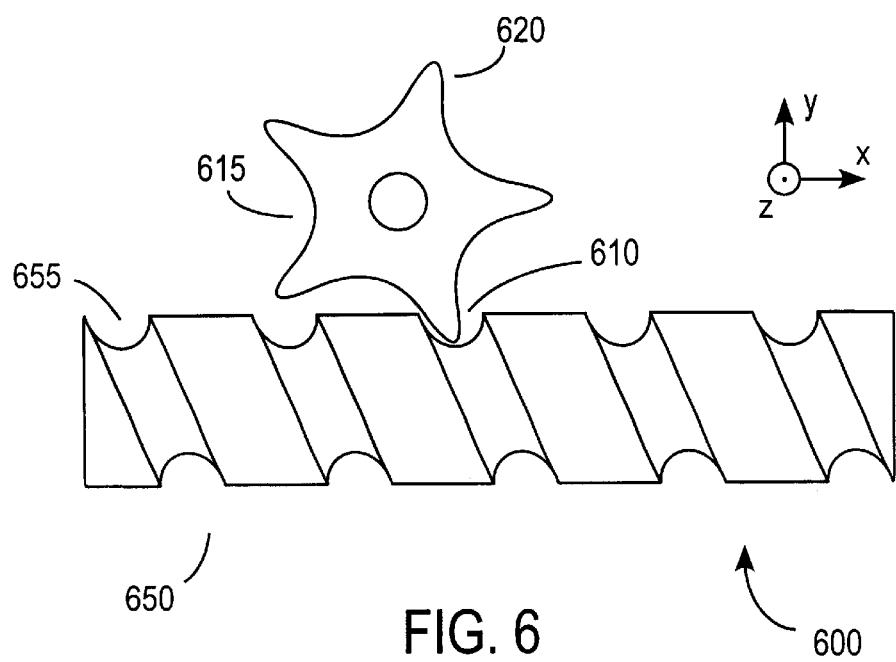
FIG. 6 is an overall perspective view of another mechanical device having low-friction moving interfaces according to an embodiment of the present invention.

FIG. 6 is a schematic cross-sectional view of a mechanical device 600 having a low-friction moving interface 610 according to another embodiment of the present invention. The mechanical device includes a gear 615 (an example of a toothed member) that has a plurality of gear teeth 620 and includes a worm gear 650 (an example of a tooth-engaging member) that has a thread 655. As shown, gear teeth 620 and thread 655 are in meshing contact. Mechanical device 600 provides for two types of motion: (a) worm gear 650 may be rotated about the x-axis causing gear 615 to rotate about the z-axis, or (b) gear 615 may be rotated about the z-axis causing the worm gear to rotate about the x-axis.

Both the gear and/or rack shown in FIG. 5 and the gear and/or worm gear shown in FIG. 6 may be coupled to a devices 200, 300, or 400 shown in FIGS. 2, 3, and 4. For example, the second member 252 (FIG. 2) having a spindle shape may be coupled to the center of rotation of gear 515 and/or worm gear 550. Both gear 610 and worm gear 650 have similar maximum dimension as those of gear 510 and rack 550 shown in FIG. 5 and can be fabricated by similar methods.

Conclusion

While the above is a complete description of specific embodiments of the invention, various modifications, alternative constructions, and equivalents by be used. For example, diamond-silicon, diamond-diamond, and the like may be variously configured while still providing low sticking, low galling, and relatively high flash temperature devices. For example, device 200 may have a first member 215 that has a trench instead of an aperture in which the second member is in sliding contact. Further, diamond-silicon, diamond-diamond, and the like meshing interfaces may include, for example, gear on gear interfaces in addition to gear on rack/worm gear interfaces. Therefore, the above description should not be taken as limiting the scope of the invention a defined by the claims.

What is claimed is:

1. A low-friction device having a moving interface, the low-friction device comprising first and second members wherein:
    each of the members has a maximum dimension of about 100 $\mu$m or less between any two points;
    at least the first member is formed of diamond; and
    the first and second members are in sliding contact.

2. The low-friction device of claim 1 wherein the second member is formed of a material chosen from the group consisting of diamond, silicon, quartz, and a III–V semiconductor material.

3. The low-friction device of claim 2 wherein one of the members has a cylindrical shape with an aperture.

4. The low-friction device of claim 3 wherein the other of the members has a spindle shape.

5. The low-friction device of claim 2 wherein:
    one of the members has a ball end and the other of the members has a socket; and
    the first and second members form a ball-and-socket joint.

6. The low-friction device of claim 2 wherein; one of the members is a bushing and the other of the members is a spindle.

7. The low-friction device of claim 2 wherein each of the members has a maximum dimension of about 50 $\mu$m or less between any two points.

8. The low-friction device of claim 2 wherein each of the members has a maximum dimension of about 25 $\mu$m or less between any two points.

9. The low-friction device of claim 2 wherein each of the members has a maximum dimensions of about 5 $\mu$m or less between any two points.

10. A low-friction device having a moving interface comprising:
    a toothed member having a maximum dimension of about 100 $\mu$m or less between any two points; and
    a tooth-engaging member having a maximum dimension of about 100 $\mu$m or less between any two points;
    at least one of the toothed member and tooth-engaging member being diamond; and
    the toothed member and the tooth-engaging member being in meshing contact.

11. The low-friction device of claim 10 wherein the other of the toothed member and tooth-engaging member is chosen from the group consisting of diamond, silicon, quartz, and a III–V semiconductor material.

12. The low-friction device of claim 11 wherein the toothed member is a gear.

13. The low-friction device of claim 12 wherein the tooth-engaging member is a gear.

14. The low-friction device of claim 12 wherein the tooth-engaging member is a rack.

15. The low-friction device of claim 14 and further comprising an electric linear actuator coupled to the rack, wherein the actuator causes the rack to be translated causing the gear to rotate.

16. The low-friction device of claim 14 and further comprising a piezoelectric transducer coupled to the rack, wherein the piezoelectric transducer causes the rack to be translated causing the gear to rotate.

17. The low-friction device of claim 14 and further comprising a thermal expansion/contraction device coupled to the rack, wherein the device causes the rack to be translated causing the gear to rotate.

18. The low-friction device of claim 12 wherein the tooth-engaging member is a worm gear.

19. The low-friction device of claim 11 wherein each of the gear and the tooth-engaging member has a maximum dimension of about 50 $\mu$m or less between any two points.

20. The low-friction device of claim 11 wherein the each of the gear and the tooth-engaging member has a maximum dimension of about 25 $\mu$m or less between any two points.

21. The low-friction device of claim 11 wherein each of the gear and the tooth-engaging member has a maximum dimension of about 5 $\mu$m or less between any two points.

22. A low-friction device having a moving interface comprising:
    a diamond gear having a maximum dimension of about 100 $\mu$m or less between any two points; and
    a silicon gear having a maximum dimension of about 100 $\mu$m or less between any two points;
    wherein the diamond gear and the silicon gear are in meshing contact.

23. A low-friction moving interface comprising:
    a diamond bearing having a maximum dimension of about 100 $\mu$m or less between any two points; and
    a silicon spindle having a maximum dimension of about 100 $\mu$m or less between any two points;
    wherein the bearing and spindle are in sliding contact.

24. A low-friction device having a moving interface comprising:
    a silicon plate having a diamond coated aperture, the coated aperture having a diameter in the range of about 100 $\mu$m to about 5 $\mu$m; and
    a spindle fitted into the diamond coated aperture in sliding contact, the spindle having a maximum dimension of about 100 $\mu$m or less between any two points.

25. A low-friction device having a moving interface comprising:
    a silicon plate formed with an aperture having a diameter in the range of about 100 $\mu$m to about 5 $\mu$m;
    a diamond bushing inside the aperture; and
    a spindle having a maximum dimension of about 100 $\mu$m or less between any two points;
    wherein the diamond bushing and the spindle are in sliding contact.

26. The low-friction device of claim 25 wherein the spindle is chosen from the group consisting of diamond, silicon, quartz, and a III–V semiconductor material.

27. A low-friction device having a moving interface comprising first, second, and third plates, wherein:
    each of the first, second, and third plates has a maximum dimension of about 100 $\mu$m or less between any two points; and the third plate is diamond; and
    the third plate has a rotational degree of freedom and is in sliding contact with the first and second plates.

28. The low-friction device of claim 27 wherein the first and second plates are chosen from the group consisting of diamond, silicon, quartz, and a III–V semiconductor material.

29. The low-friction device of claim 28 wherein the first, second, and third plates are a fluid pump.

30. A low-friction device comprising first and second plates, wherein:
   each of the first and second plates has a maximum dimension of about 100 μm or less between any two points;
   one of the first and second plates is diamond;
   the other of the first and second plate is silicon; and
   the first and second plates are in sliding contact.

31. The low-friction device of claim 30 wherein the first and second plates are chosen from the group consisting of diamond, silicon, quartz, and a III–V semiconductor material.

32. The low-friction device of claim 31 wherein the second plate has a slot, and portions of the first plate are in the slot.

33. The low-friction device of claim 32 wherein the first and second plates are a fluid pump.

* * * * *